United States Patent
Santamaria Razo et al.

(10) Patent No.: US 12,029,128 B2
(45) Date of Patent: Jul. 2, 2024

(54) CONCRETE COMPOSITE

(71) Applicant: CRH Nederland B.V., Amsterdam (NL)

(72) Inventors: Diego A. Santamaria Razo, Amsterdam (NL); José Amir González Calderón, Celaya (MX)

(73) Assignee: CRH NEDERLAND B.V., Amsterdam (NL)

( * ) Notice: Subject to any disclaimer, the term of this patent is extended or adjusted under 35 U.S.C. 154(b) by 0 days.

(21) Appl. No.: 17/854,343

(22) Filed: Jun. 30, 2022

(65) Prior Publication Data

US 2023/0006122 A1  Jan. 5, 2023

(30) Foreign Application Priority Data

Jun. 30, 2021 (EP) .................................... 21182797

(51) Int. Cl.

| | | |
|---|---|---|
| *H10N 10/857* | (2023.01) | |
| *C04B 14/06* | (2006.01) | |
| *C04B 18/02* | (2006.01) | |
| *C04B 22/14* | (2006.01) | |
| *C04B 28/04* | (2006.01) | |
| *C04B 111/94* | (2006.01) | |
| *H01B 1/10* | (2006.01) | |
| *H10N 10/01* | (2023.01) | |

(52) U.S. Cl.
CPC ........... *H10N 10/857* (2023.02); *C04B 14/06* (2013.01); *C04B 18/022* (2013.01); *C04B 22/14* (2013.01); *C04B 28/04* (2013.01); *H01B 1/10* (2013.01); *H10N 10/01* (2023.02); *C04B 2111/94* (2013.01); *C04B 2201/30* (2013.01)

(58) Field of Classification Search
CPC ...... H10N 10/01; H10N 10/857; C04B 14/06; C04B 18/022; C04B 22/14; C04B 28/04; C04B 2201/30; C04B 2111/94; H01B 1/10
See application file for complete search history.

(56) References Cited

U.S. PATENT DOCUMENTS

| | | | |
|---|---|---|---|
| 2015/0200345 A1* | 7/2015 | Morelli | H10N 10/853 |
| | | | 136/201 |
| 2018/0090655 A1* | 3/2018 | Santamaria Razo | |
| | | | H10N 10/856 |
| 2018/0375007 A1* | 12/2018 | Jin | H10N 10/17 |

FOREIGN PATENT DOCUMENTS

| | | | |
|---|---|---|---|
| CN | 103790089 A | * | 5/2014 |
| CN | 103819136 A | * | 5/2014 |
| CN | 104030607 A | * | 9/2014 |
| CN | 104030607 A | | 10/2014 |
| CN | 106220079 | | 12/2016 |
| CN | 106220079 A | | 12/2016 |
| CN | 107151123 | | 9/2017 |
| WO | 2016146855 | | 9/2016 |

OTHER PUBLICATIONS

CN-104030607-A English machine translation (Year: 2014).*
CN-103819136-A English machine translation (Year: 2014).*
CN-103790089-A English machine translation (Year: 2014).*
Extended Search Report for EP21182797.7 dated Dec. 10, 2021.
Examination Search Report dated Jun. 8, 2023, from the CA Intellectual Property Office for corresponding CA application No. 3,166,015.

* cited by examiner

*Primary Examiner* — Andrew J Golden
(74) *Attorney, Agent, or Firm* — Christopher M. Scherer; DeWitt LLP

(57) ABSTRACT

The present invention relates to a concrete composite comprising concrete and a thermoelectric material, wherein the thermoelectric material comprises a complex sulphide mineral, wherein the composite comprises at least 20 wt % concrete.

16 Claims, No Drawings

CONCRETE COMPOSITE

CROSS-REFERENCE TO RELATED APPLICATIONS

The present application claims priority to European Patent Application No. 21182797.7, filed Jun. 30, 2021, the contents of which are incorporated herein by reference in their entireties.

FIELD OF THE INVENTION

The invention relates to a concrete composite, an electrical circuit comprising the concrete composite, a method of generating a potential difference, a method of making a concrete composite, and a wall, a floor, a post or a building comprising a concrete composite.

BACKGROUND TO THE INVENTION

Thermoelectric effects are well known. The Seebeck effect is a form of thermoelectric effect which appears when a temperature difference between two different electrical conductors or semiconductors produces a voltage difference between the two substances. When heat is applied to one of the two conductors or semiconductors, the heated electrons tend to flow from the hottest conductor or semiconductor to the coldest. If the pair is connected through an electrical circuit, direct current (DC) flows through that circuit. The voltages produced by the Seebeck effect are small, usually a few microvolts (millionths of a volt) per temperature difference at the junction. If the temperature difference is large enough, some Seebeck devices can produce millivolts (thousandths of a volt).

Thermoelectric materials which show the Seebeck effect, such as tetrahedrite, are known. The conversion efficiency of this type of material is often expressed as the dimensionless figure of merit: ZT, where T is the absolute temperature and Z is related to the material properties as $ZT=S^2 \sigma T/K$, where S is a high thermal power or Seebeck coefficient, $\sigma$ is electrical conductivity and $\kappa$ is thermal conductivity. To improve the efficiency of thermoelectric materials, ZT should be maximized. This means that more electric potential is produced for a given temperature difference.

There are increasing demands for electricity, particularly electricity use in buildings. It is desirable for buildings to become more self-sufficient in producing energy, and existing solutions such as utilising solar power and heat pumps are known to provide part of an electricity supply to a building, such as a heating or hot water system.

There is a need to produce electricity in an environmentally friendly way. There is a need for construction to be energy efficient. There is a need for buildings to become more self-sufficient in generating electricity for use. There is a need to utilise construction materials to generate electricity. There is a need to recycle waste materials from mining. There is a need to reduce the amount of binder used in making concrete, particularly the amount of Portland cement or clinker used.

It is, therefore, an object of the present invention to seek to alleviate the above identified problems.

SUMMARY OF THE INVENTION

In a first aspect of the invention, there is provided a concrete composite comprising concrete and a thermoelectric material, wherein the thermoelectric material comprises a complex sulphide mineral, wherein the composite comprises at least 20 wt % concrete.

In a second aspect of the invention, there is provided an electrical circuit comprising the concrete composite according to the first aspect of the invention and a pair of electrical conductors.

In a third aspect of the invention, there is provided a method of generating a potential difference, comprising providing a concrete composite according to the first aspect of the invention, providing a temperature difference between a first side of the composite and a second side of the composite and connecting the composite via a pair of electrical conductors to an electrical circuit.

In a fourth aspect of the invention, there is provided a wall, a floor, a post or a building comprising the concrete composite according to the first aspect of the invention.

In a fifth aspect of the invention, there is provided a method of making a concrete composite, comprising:
a. providing aggregate;
b. providing a binder;
c. providing a thermoelectric material, wherein the thermoelectric material comprises a complex sulphide mineral;
d. mixing the aggregate, the binder and the thermoelectric material to form a mixture; and
e. forming the mixture into the composite, wherein the composite comprises at least 20 wt % concrete.

In a sixth aspect of the invention, there is provided the use of a composite according to the first aspect of the invention to generate electricity.

DETAILED DESCRIPTION

The present invention relates to a concrete composite comprising concrete and a thermoelectric material, wherein the thermoelectric material comprises a complex sulphide mineral, wherein the composite comprises at least 20 wt % concrete.

The composite allows electricity to be produced in an environmentally friendly way by utilising the temperature difference across the composite and the environment the substrate is in. For example, the temperature of an external wall and the temperature of a room. Further, the present invention can be used to recycle waste materials from mining, such as the complex sulphide mineral. This is an efficient use of waste materials and is energy efficient. The invention utilises a temperature difference to produce electricity which will reduce the need to obtain electricity from an external source. This improves the energy efficiency of a building and reduces its carbon footprint.

Surprisingly, the use of a thermoelectric material as described herein allows the amount of binder used in concrete to be reduced, such as the amount of Portland cement or clinker. The thermoelectric material acts as a supplementary cementitious material in addition to its thermoelectric properties. This dual effect allows concrete to be produced which is more environmentally friendly as it reduces the amount of binder used in concrete and the resulting composite can be used to produce electricity.

Preferably, the complex sulphide mineral comprises a compound comprising a metal, a semimetal and sulphur, preferably the thermoelectric material comprises a metal antimony sulphide, preferably a copper antimony sulphide. Such materials have a desirable thermoelectric effect.

Preferably, the thermoelectric material comprises tetrahedrite, preferably the thermoelectric material comprises tetrahedrite of the formula $Cu_{12-x}M_xZ_4S_{13-y}Se_y$, wherein M is a transition metal, 0≤x≤3, Z is a semimetal and 0≤y≤0.5, preferably Z is Sb, As, Bi, Te or a combination of two or more thereof.

Preferably, Z is Sb, As, Bi or a combination of two or more thereof, preferably Z is Sb, As or a combination thereof, preferably Z is Sb.

Preferably, M is Mn, Ag, Fe, Ni, Co, Zn, Hg or a combination of two or more thereof, preferably Mn, Ag, Fe, Ni, Co or a combination of two or more thereof, preferably Mn, Ag, Fe or a combination of two or more thereof. Preferably, M comprises Zn.

Preferably, y is about 0.

Preferably, the thermoelectric material comprises a compound of the formula $Cu_{11}MnSb_4S_{13}$.

Preferably, the thermoelectric material is a thermal insulator. This enhances the thermoelectric effect by helping to maintain a temperature difference across the composite.

It is an advantage of the invention that tetrahedrite can be used as the thermoelectric material as this is a byproduct from mining. Further, the data shows the advantages of using this material.

Preferably, the composite comprises about 0.1 wt % to about 3 wt % thermoelectric material, preferably about 0.2 wt % to about 2 wt % thermoelectric material. Such amounts allow electricity to be generated across the composite. Further, such amounts do not substantially change the appearance of the composite which is desirable for aesthetic reasons.

Preferably, the thermoelectric material is in the form of particles, preferably the particles have a diameter in the range of about 100 nm to about 1 mm, preferably in the range of about 150 nm to about 1 mm, preferably in the range of about 500 nm to about 500 μm, preferably about 1 μm to about 200 μm, preferably about 10 μm to about 100 μm. Particles are a suitable way to distribute the thermoelectric material throughout the composite. The particle sizes are suitable to show a useful thermoelectric effect. Further, such particle sizes do not substantially change the appearance of the composite which is desirable for aesthetic reasons. Particle size is preferably measured by laser diffraction.

Preferably, the composite further comprises an electrically conductive additive, preferably the electrically conductive additive comprises carbon nanotubes, graphene, petroleum coke, graphite, zinc, iron or a combination of two or more thereof, preferably single walled carbon nanotubes. Such materials enhance the electrical conductivity of the composite to improve the thermoelectric effect.

Preferably, the composite comprises about 1 wt % to about 25 wt % electrically conductive additive, preferably about 10 wt % to about 20 wt %. Such amounts are useful for improving the thermoelectric effect.

Preferably, the composite does not comprise an electrically conductive additive. It is an advantage that the invention does not require an electrically conductive additive.

Preferably, the composite further comprises a polymer, preferably the polymer comprises polyethylene, polypropylene, polystyrene, polyaniline (PANI), polyalkyl thiophenes, poly(3,4-ethylenedioxythiophene) (PEDOT), polyacetylene, or a combination of two or more thereof, preferably the polymer comprises polyurethane, polyethylene, polypropylene, polystyrene, epoxy resin, polyacetylene, or a combination of two or more thereof. Such polymers are thermal insulators which enhances the thermoelectrical effect.

Preferably, the polymer comprises a thermoplastic polymer, preferably polyethylene, polypropylene or polystyrene, preferably polyethylene or polypropylene. Such polymers allow the composite to be easily fabricated. It is advantageous that they are thermal insulators as this enhances the thermoelectric effect by helping to maintain the temperature difference across the composite.

Preferably, the polymer is an electrically conductive polymer, preferably, polyaniline (PANI) or (3,4-ethylenedioxythiophene) (PEDOT). Such polymers help enhance the thermoelectric effect.

Preferably, the composite does not comprise an electrically conductive polymer. It is an advantage that the invention does not require an electrically conductive polymer.

Preferably, the composite is substantially homogeneous. This allows the thermoelectric effect to be substantially consistent throughout the composite for a given temperature difference. Preferably, this means that the composite has a substantially even distribution of components throughout the composite.

Preferably, the composite comprises about 20 wt % concrete to about 99% concrete, preferably about 25 wt % to about 90 wt % concrete, preferably about 30 wt % to about 80 wt % concrete. This amount of concrete aids the structural rigidity of the composite. This is particularly important in building materials. It is an advantage of the invention that the concrete composite can be used in place of concrete not containing the thermoelectric material of the invention. It is a further advantage that the thermoelectric effect can be usefully utilised with such levels of binder. Preferably, the amount of concrete is the amount present in the final composite. Preferably, the concrete acts as a binder. In this way, the composite has sufficient structural integrity.

Preferably, the concrete comprises a binder and an aggregate. Preferably the binder comprises Portland cement. Preferably the aggregate comprises sand and/or gravel.

Preferably, the composite comprises:
at least about 20 wt % concrete, preferably about 20 wt % concrete to about 99% concrete, preferably about 25 wt % to about 90 wt % concrete, preferably about 30 wt % to about 80 wt % concrete;
about 0.1 wt % to about 3 wt % thermoelectric material, preferably about 0.2 wt % to about 2 wt % thermoelectric material; and
optionally about 1 wt % to about 25 wt % electrically conductive additive, preferably about 10 wt % to about 20 wt %.

Preferably, the thermoelectric material and optional electrically conductive additive are distributed in the polymer, preferably in a polymer matrix, preferably the polymer matrix is in the form of a block, preferably an array of blocks, preferably a single layer of blocks. Preferably the block or blocks are substantially covered by concrete, preferably less than about 10% of the surface area of the block(s) is visible, preferably less than about 5%, preferably less than about 2%, preferably none of the surface area of the block(s) is visible. An advantage of this is that the thermoelectric material is placed in a known position. Further, the thermoelectric material is electrically insulated by the concrete. The blocks may act as a plurality of generators of electricity. Preferably, the blocks are electrically connected, such as using a wire.

Preferably, the blocks comprises at least about 25 wt % polymer, preferably about 25 wt % to about 97 wt %, preferably about 30 wt % to about 90 wt %, preferably about 50 wt % to about 80 wt %. Such amounts are suitable for forming blocks with structural rigidity.

Preferably, the blocks are not in direct contact with adjacent blocks. This helps enhance the thermoelectric effect. Preferably, the blocks are substantially separated by concrete.

Preferably, each block has a length in the range of about 5 cm to about 15 cm, preferably about 8 cm to about 12 cm.

Preferably, each block has a width in the range of about 0.5 cm to about 5 cm, preferably about 1 cm, to about 3 cm.

Preferably, each block has a height in the range of about 0.5 cm to about 5 cm, preferably about 1 cm to about 3 cm.

Preferably, each block is substantially rectangular. This allows efficient manufacture and use of the blocks.

The present invention relates to a concrete composite comprising concrete and at least one block formed from a polymer matrix, wherein a thermoelectric material is distributed in the polymer matrix, wherein the thermoelectric material comprises a complex sulphide mineral. Preferably, the concrete composite comprises the further features described herein.

The present invention relates to a concrete composite comprising concrete and a thermoelectric material, wherein the thermoelectric material comprises a complex sulphide mineral. Preferably, the concrete composite comprises the further features described herein.

Another aspect of the present invention relates to an electrical circuit comprising the concrete composite as described herein and a pair of electrical conductors. This allows the electricity generated to be used. Preferably, the electrical conductors described herein comprise a metal, preferably copper or aluminium, preferably copper.

Another aspect of the present invention relates to a method of generating a potential difference, comprising providing a concrete composite as described herein, providing a temperature difference between a first side of the composite and a second side of the composite and connecting the composite via a pair of electrical conductors to an electrical circuit.

Another aspect of the present invention relates to the use of a composite according to the first aspect of the invention to generate electricity.

Preferably, in use a temperature difference is provided between a first side of the composite and a second side of the composite, and the composite is connected via a pair of electrical conductors to an electrical circuit.

Another aspect of the present invention relates to a wall, a floor, a post or a building comprising the concrete composite described herein. These are items that may have a temperature difference across them, such as across an external wall. This allows electricity to be generated.

The present invention relates to a method of making a concrete composite, comprising:
a. providing aggregate;
b. providing a binder;
c. providing a thermoelectric material, wherein the thermoelectric material comprises a complex sulphide mineral;
d. mixing the aggregate, the binder and the thermoelectric material to form a mixture; and
e. forming the mixture into the composite, wherein the composite comprises at least 20 wt % concrete.

Such a method is suitable for producing a composite according to the invention. It is an advantage of the invention that the thermoelectric material may be incorporated into the composite at mixing step d. This allows for an efficient process of manufacture and a consistent composite may be produced.

Preferably, the thermoelectric material is provided in a polymer matrix, preferably the polymer matrix is in the form of a block, preferably an array of blocks, preferably a single layer of blocks, preferably the aggregate and binder are mixed and surround the blocks.

The present invention relates to a method of making a concrete composite, comprising:
A. providing aggregate;
B. providing a binder;
C. providing a block of polymer matrix, wherein a thermoelectric material is distributed in the polymer matrix, wherein the thermoelectric material comprises a complex sulphide mineral;
D. mixing the aggregate and the binder to form a mixture; and
E. positioning the block in the mixture to form the composite.

EXAMPLES

Example 1

Test samples were produced to show the thermoelectric effect generated using different polymers and tetrahedrite with different particle sizes.

Test samples were made with a thickness of 5 mm, a width of 1 cm and a length of 5 cm.

Samples containing polyethylene and polypropylene were made as set out below. The tetrahedrite particles were incorporated into the polymer by extrusion in a twin-screw extruder with three heating zones. The mixture was pelletized and then hot pressed and cut to size to form the film samples.

Samples containing cement were made as set out below. A paste was prepared using cement and water in a ratio of 2:1. The cement was mixed with the tetrahedrite particles through a ball mill with a capacity of 500 grams for 10 minutes to ensure incorporation of the particles. Once mixed, the mixture was introduced into an orbital mixing container and the water was added to reach the desired water/cement ratio of 0.5. Finally, the paste was emptied into a metal mold to obtain specimens of 1 cm×5 cm with a thickness of 5 mm of the mixture and the excess paste was removed. The mold was placed in a container with water, which was removed from the mold on the second day, and it was allowed to cure for 2 weeks, and it was finally dried for 2 days prior to the tests.

The conductivity test was carried out by placing the samples longitudinally making contact in a 1 cm square section with the plates at the ends, leaving a 3 cm long section free between both plates. The dishes were designed to have a temperature gradient of 80° C. between both ends, placing thermocouples at the ends to monitor and control the temperature. In the upper area of the composite materials, the positive and negative sensors of a digital multimeter were fixed with thermal paste to evaluate their thermoelectric response. The conductivity results obtained from this test are shown in Table 1. As shown in Table 1, the tetrahedrite dosage in each sample was 0.5% w/w, 1% w/w or 2% w/w. No thermoelectric effect was shown in samples that did not include tetrahedrite.

TABLE 1

| Polymer | Particle size of tetrahedrite (μm) | Conductivity ×10^-2 (S/cm) Tetrahedrite Dosage (% w/w) | | |
| --- | --- | --- | --- | --- |
| | | 0.5 | 1 | 2 |
| Polypropylene | 10 | 3.1 | 5.2 | 3.8 |
| Polypropylene | 50 | 4 | 4.5 | 3.6 |
| Polypropylene | 90 | 2.3 | 1.8 | 1.7 |
| Polyethylene | 10 | 6.5 | 7.3 | 7.1 |
| Polyethylene | 50 | 7.8 | 7.6 | 6.6 |
| Polyethylene | 90 | 5.8 | 6.1 | 5.7 |
| Cement | 10 | 1.3 | 1.6 | 1.5 |
| Cement | 50 | 1 | 1.2 | 0.8 |
| Cement | 90 | 0.6 | 0.6 | 0.4 |

The results show that the samples give thermoelectric effect and can thus be used as a composite as set out in the invention. The examples using cement are indicative that the technical effect will be shown in concrete. The conductivity in cement is lower than the conductivity in polypropylene, however it can be advantageous from a process point of view to incorporate the thermoelectric material directly in a method of making concrete.

Within this specification embodiments have been described in a way which enables a clear and concise specification to be written, but it is intended and will be appreciated that embodiments may be variously combined or separated without parting from the invention. For example, it will be appreciated that all preferred features described herein are applicable to all aspects of the invention described herein and vice versa. For example, all preferred features of the composite apply to all aspects of the invention.

Within this specification, the term "about" means plus or minus 20%, more preferably plus or minus 10%, even more preferably plus or minus 5%, most preferably plus or minus 2%.

Within this specification, the term "substantially" means a deviation of plus or minus 20%, more preferably plus or minus 10%, even more preferably plus or minus 5%, most preferably plus or minus 2%.

Within this specification, reference to "substantially" includes reference to "completely" and/or "exactly". That is, where the word substantially is included, it will be appreciated that this also includes reference to the particular sentence without the word substantially.

Within this specification, "thermal insulator" preferably means a thermal conductivity of less than about 10 $Wm^{-1}K^{-1}$, preferably less than 5 $Wm^{-1}K^{-1}$, preferably less than 2 $Wm^{-1}K^{-1}$, preferably less than 1 $Wm^{-1}K^{-1}$.

It should be understood that various changes and modifications to the presently preferred embodiments described herein will be apparent to those skilled in the art. Such changes and modifications can be made without departing from the spirit and scope of the present invention and without diminishing its attendant advantages. It is therefore intended that such changes and modifications are covered by the appended claims.

The present invention may be described in accordance with the following clauses:

1. A concrete composite comprising concrete and a thermoelectric material, wherein the thermoelectric material comprises a complex sulphide mineral, wherein the composite comprises at least 20 wt % concrete.
2. A composite according to clause 1, wherein the complex sulphide mineral comprises a compound comprising a metal, a semimetal and sulphur, preferably wherein the thermoelectric material comprises a metal antimony sulphide, preferably a copper antimony sulphide.
3. A composite according to any preceding clause, wherein the thermoelectric material comprises tetrahedrite, preferably wherein the thermoelectric material comprises tetrahedrite of the formula $Cu_{12-x}M_x Z_4S_{13-y}Se_y$, wherein M is a transition metal, $0 \leq x \leq 3$, Z is a semimetal and $0 \leq y \leq 0.5$, preferably wherein Z is Sb, As, Bi, Te or a combination of two or more thereof, preferably wherein Z is Sb, As, Bi or a combination of two or more thereof, preferably wherein Z is Sb, As or a combination thereof, preferably wherein Z is Sb; and/or
   wherein M is Mn, Ag, Fe, Ni, Co, Zn, Hg or a combination of two or more thereof, preferably Mn, Ag, Fe, Ni, Co or a combination of two or more thereof, preferably Mn, Ag, Fe or a combination of two or more thereof; and/or wherein y is about 0; and/or
   wherein the thermoelectric material comprises a compound of the formula $Cu_{11}MnSb_4S_{13}$.
4. A composite according to any preceding clause, comprising about 0.1 wt % to about 3 wt % thermoelectric material, preferably about 0.2 wt % to about 2 wt % thermoelectric material; and/or wherein the thermoelectric material is in the form of particles, preferably wherein the particles have a diameter in the range of about 100 nm to about 1 mm, preferably in the range of about 500 nm to about 500 μm, preferably about 1 μm to about 200 μm, preferably about 10 μm to about 100 μm.
5. A composite according to any preceding clause, further comprising an electrically conductive additive, preferably:
   i) wherein the electrically conductive additive comprises carbon nanotubes, graphene, petroleum coke, graphite, zinc, iron or a combination of two or more thereof, preferably single walled carbon nanotubes; and/or
   ii) comprising about 1 wt % to about 25 wt % electrically conductive additive, preferably about 10 wt % to about 20 wt %.
6. A composite according to any preceding clause, wherein the composite further comprises a polymer, preferably wherein the polymer comprises polyurethane, polyethylene, polypropylene, polystyrene, epoxy resin, polyaniline (PANI), polyalkyl thiophenes, poly(3,4-ethylenedioxythiophene) (PEDOT), polyacetylene, or a combination of two or more thereof, preferably wherein the polymer comprises polyurethane, polyethylene, polypropylene, polystyrene, epoxy resin, polyacetylene, or a combination of two or more thereof.
7. A composite according to any preceding clause, wherein the composite is substantially homogeneous; and/or wherein the concrete comprises a binder and/or an aggregate, preferably the binder comprises Portland cement; and/or preferably the aggregate comprises sand and/or gravel.
8. A composite according to clause 6, wherein the thermoelectric material and optional electrically conductive additive are distributed in the polymer, preferably in a polymer matrix, wherein the polymer matrix is in the form of a block, preferably an array of blocks, preferably a single layer of blocks, preferably wherein each block has a length in the range of about 5 cm to about 15 cm, preferably about 8 cm to about 12 cm; and/or wherein each block has a width in the range a width in the range of about 0.5 cm to about 5 cm, preferably about 1 cm, to about 3 cm; and/or wherein each block has a height in the of about 0.5 cm to about 5 cm, preferably about 1 cm to about 3 cm.

9. An electrical circuit comprising a concrete composite according to any preceding clause and a pair of electrical conductors.

10. A method of generating a potential difference, comprising providing a concrete composite according to any of clauses 1 to 8, providing a temperature difference between a first side of the composite and a second side of the composite and connecting the composite via a pair of electrical conductors to an electrical circuit.

11. Use of a composite according to any of clauses 1 to 8 to generate electricity.

12. A wall, a floor, a post or a building comprising a concrete composite according to any of clauses 1 to 8.

13. A method of making a concrete composite, comprising:
a) providing aggregate;
b) providing a binder;
c) providing a thermoelectric material, wherein the thermoelectric material comprises a complex sulphide mineral;
d) mixing the aggregate, the binder and the thermoelectric material to form a mixture; and
e) forming the mixture into the composite, wherein the composite comprises at least 20 wt % concrete.

14. A method according to clause 13, wherein the thermoelectric material is provided in a polymer matrix, preferably wherein the polymer matrix is in the form of a block, preferably an array of blocks, preferably a single layer of blocks, preferably wherein the aggregate and binder are mixed and surround the blocks.

15. A method according to clause 13 or clause 14, further comprising the features of any of clauses 1 to 8.

The invention claimed is:

1. A concrete composite comprising concrete and a thermoelectric material, wherein the thermoelectric material comprises tetrahedrite, wherein the tetrahedrite is a supplementary cementitious material, wherein the composite comprises at least 20 wt % concrete, and wherein the composite comprises 0.2 wt % to 3 wt % of the thermoelectric material.

2. A composite according to claim 1, wherein the thermoelectric material comprises tetrahedrite of the formula $Cu_{12-x}M_xZ_4S_{13-y}Se_y$, wherein M is a transition metal, $0 \leq x \leq 3$, Z is a semimetal and $0 \leq y \leq 0.5$.

3. A composite according to claim 1, wherein the thermoelectric material is in the form of particles, wherein the particles have a diameter in the range of about 100 nm to about 1 mm.

4. A composite according to claim 1, further comprising an electrically conductive additive, wherein the electrically conductive additive comprises carbon nanotubes, graphene, petroleum coke, graphite, zinc, iron or a combination of two or more thereof.

5. A composite according to claim 4, comprising about 1 wt % to about 25 wt % electrically conductive additive.

6. A composite according to claim 1, wherein the composite further comprises a polymer.

7. A composite according to claim 6, wherein the polymer comprises polyurethane, polyethylene, polypropylene, polystyrene, epoxy resin, polyaniline (PANI), polyalkyl thiophenes, poly(3,4-ethylenedioxythiophene) (PEDOT), polyacetylene, or a combination of two or more thereof.

8. A composite according to claim 1, wherein the concrete comprises a binder and/or an aggregate.

9. A composite according to claim 8, wherein the binder comprises Portland cement and the aggregate comprises sand and/or gravel.

10. A composite according to claim 6, wherein the thermoelectric material and an optional electrically conductive additive are distributed in the polymer.

11. A composite according to claim 10, wherein the polymer is a polymer matrix in the form of a block.

12. A composite according to claim 11, wherein the polymer matrix is in the form of a single layer of blocks.

13. A method of generating a potential difference, comprising providing a concrete composite according to claim 1, providing a temperature difference between a first side of the composite and a second side of the composite and connecting the composite via a pair of electrical conductors to an electrical circuit.

14. A method of making a concrete composite, comprising:
a) providing aggregate;
b) providing a binder;
c) providing a thermoelectric material, wherein the thermoelectric material comprises tetrahedrite, wherein the tetrahedrite is a supplementary cementitious material;
d) mixing the aggregate, the binder and the thermoelectric material to form a mixture; and
e) forming the mixture into the composite, wherein the composite comprises at least 20 wt % concrete, and wherein the composite comprises 0.2 wt % to 3 wt % of the thermoelectric material.

15. A method according to claim 14, wherein the thermoelectric material is provided in a polymer matrix in the form of a block.

16. A method according to claim 15, wherein the polymer matrix is in the form of an array of blocks, wherein the aggregate and binder are mixed and surround the blocks.

* * * * *